United States Patent
Nozaki et al.

(10) Patent No.: US 6,642,087 B2
(45) Date of Patent: Nov. 4, 2003

(54) SOLID STATE IMAGING DEVICE HAVING A PHOTODIODE AND A MOSFET AND METHOD OF MANUFACTURING THE SAME

(75) Inventors: Hidetoshi Nozaki, Yokohama (JP); Ikuko Inoue, Yokohama (JP); Hirofumi Yamashita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/339,395

(22) Filed: Jan. 10, 2003

(65) Prior Publication Data

US 2003/0137008 A1 Jul. 24, 2003

Related U.S. Application Data

(62) Division of application No. 09/801,919, filed on Mar. 9, 2001.

(30) Foreign Application Priority Data

Mar. 28, 2000 (JP) ........................................ 2000-088971
Oct. 2, 2000 (JP) ........................................ 2000-302660

(51) Int. Cl.[7] .............................................. H01L 21/00
(52) U.S. Cl. ........................ 438/149; 438/48; 438/51; 438/60; 438/75; 257/231; 257/232; 257/233
(58) Field of Search ........................ 438/48, 57, 60, 438/75; 257/231, 232, 233

(56) References Cited

U.S. PATENT DOCUMENTS

| 5,463,232 A | 10/1995 | Yamashita et al. |
| 6,023,081 A | 2/2000 | Drowley et al. |
| 6,040,592 A | 3/2000 | McDaniel et al. |
| 6,040,593 A | 3/2000 | Park |
| 6,194,242 B1 * | 2/2001 | Uchiya ........................ 438/48 |

FOREIGN PATENT DOCUMENTS

| JP | 10-150182 | 6/1998 |
| JP | 11-045989 | 2/1999 |
| JP | 2001-44404 | 2/2001 |

* cited by examiner

*Primary Examiner*—David Nelms
*Assistant Examiner*—Mai-Huong Tran
(74) *Attorney, Agent, or Firm*—Oblon, Spivak, McClelland, Maier & Neustadt, P.C.

(57) ABSTRACT

A readout gate electrode is selectively formed on a silicon substrate. An N-type drain region is formed at one end of the readout gate electrode, and an N-type signal storage region is formed at the other end thereof. A P[+]-type surface shield region is selectively epitaxial-grown on the signal storage region, and a silicide block layer is formed on the surface shield region to cover at least part of the signal storage region. A Ti silicide film is selective epitaxial-grown on the drain region.

12 Claims, 13 Drawing Sheets

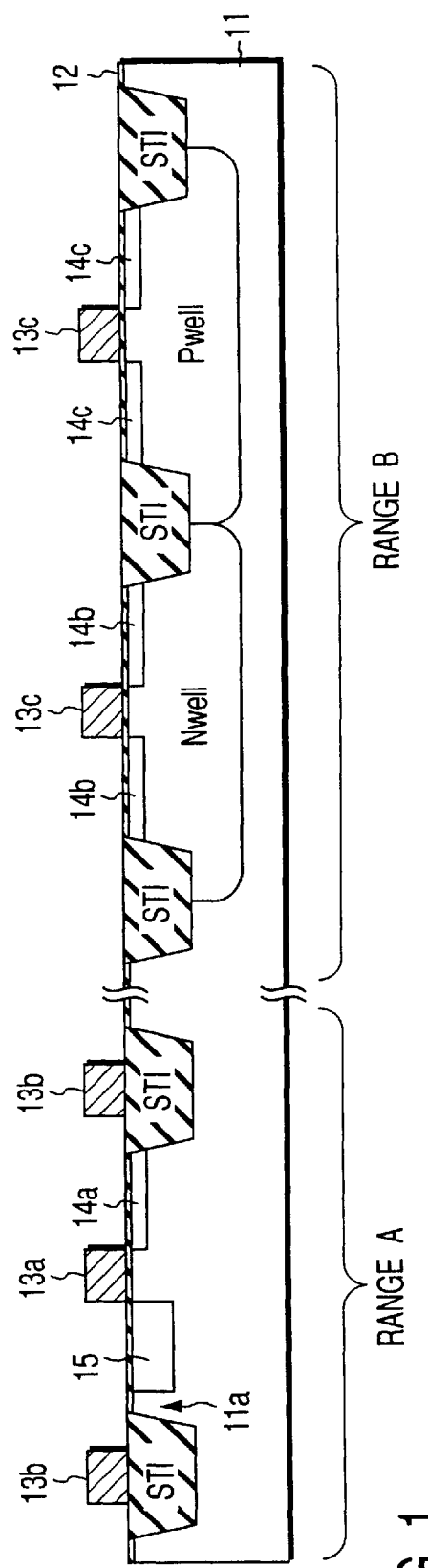
F I G. 1
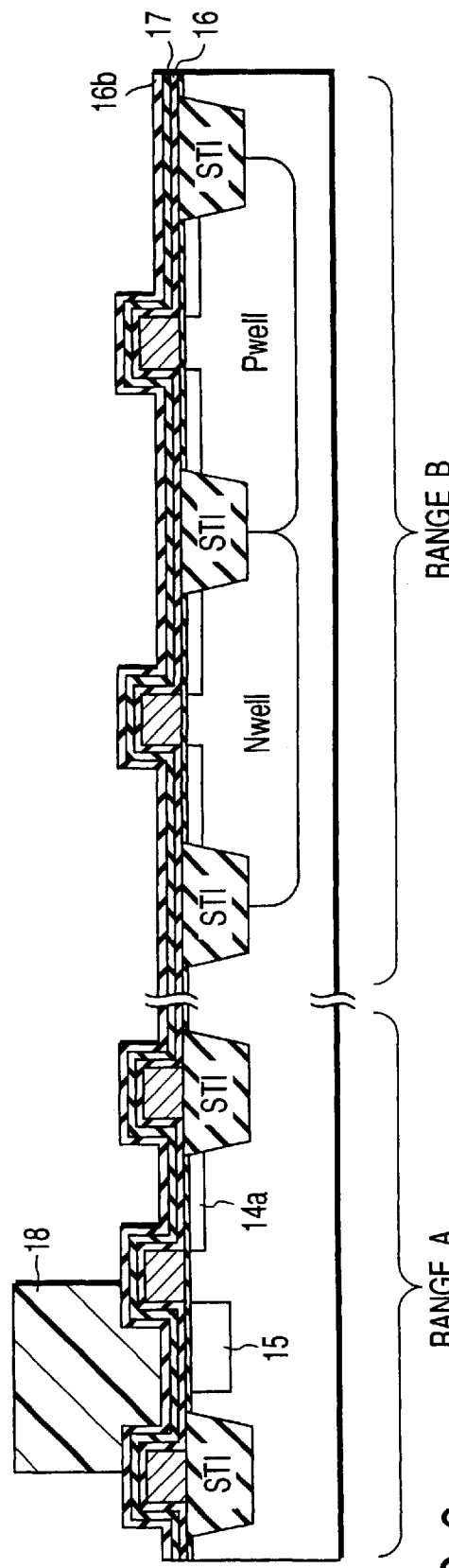
F I G. 2

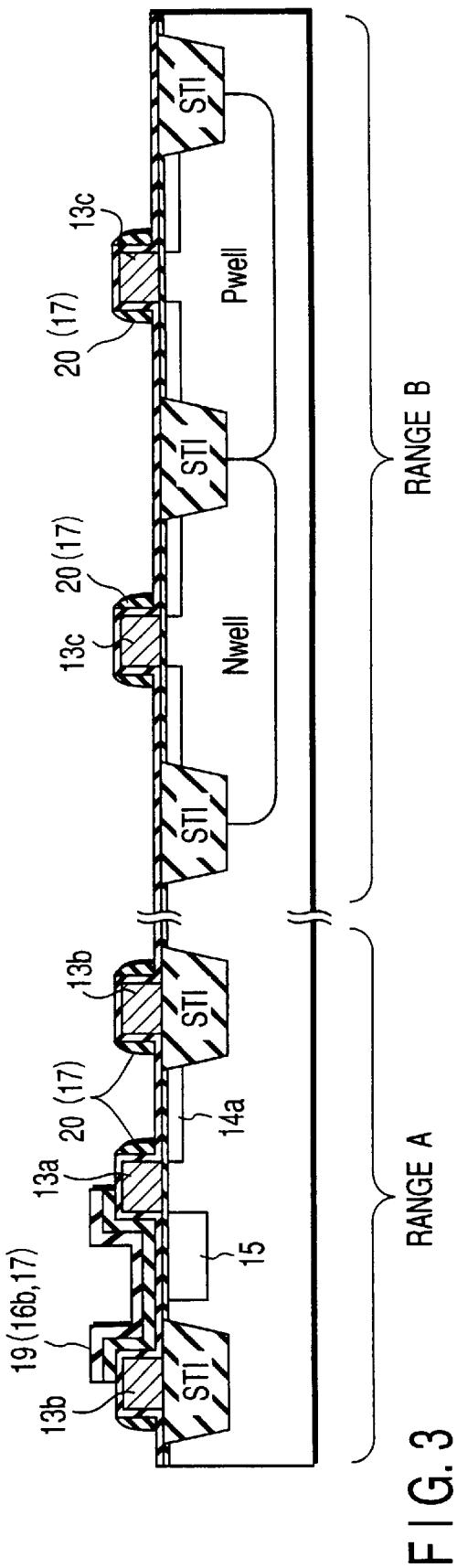
F I G. 3
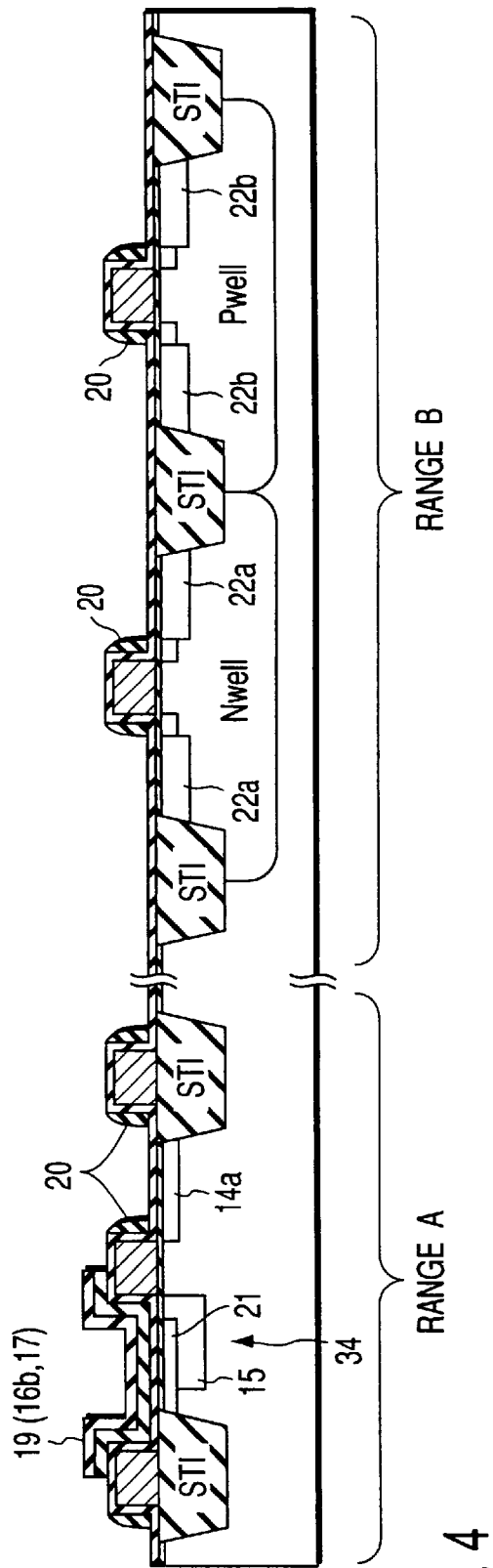
F I G. 4

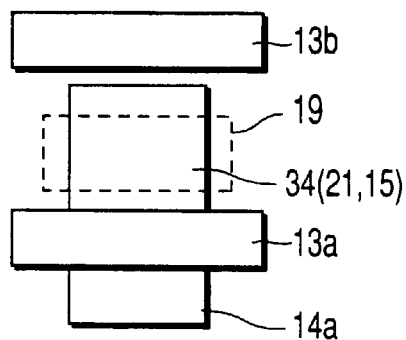
F I G. 14
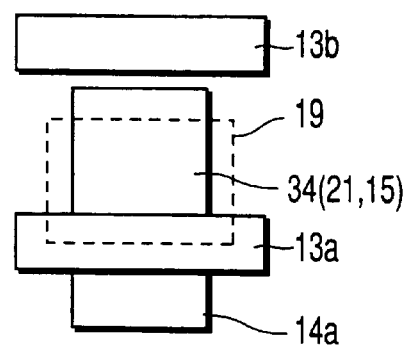
F I G. 15
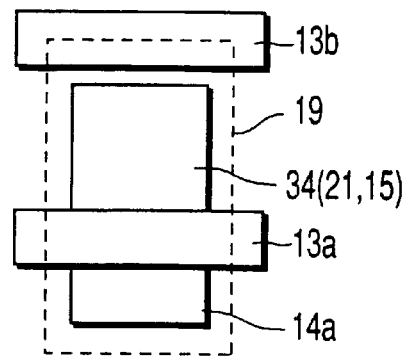
F I G. 16
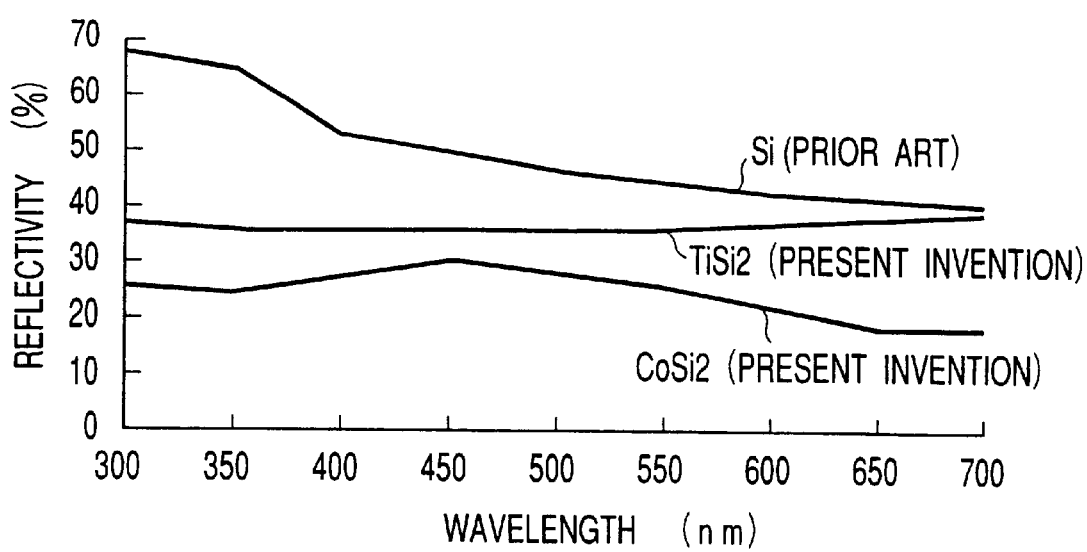
F I G. 17

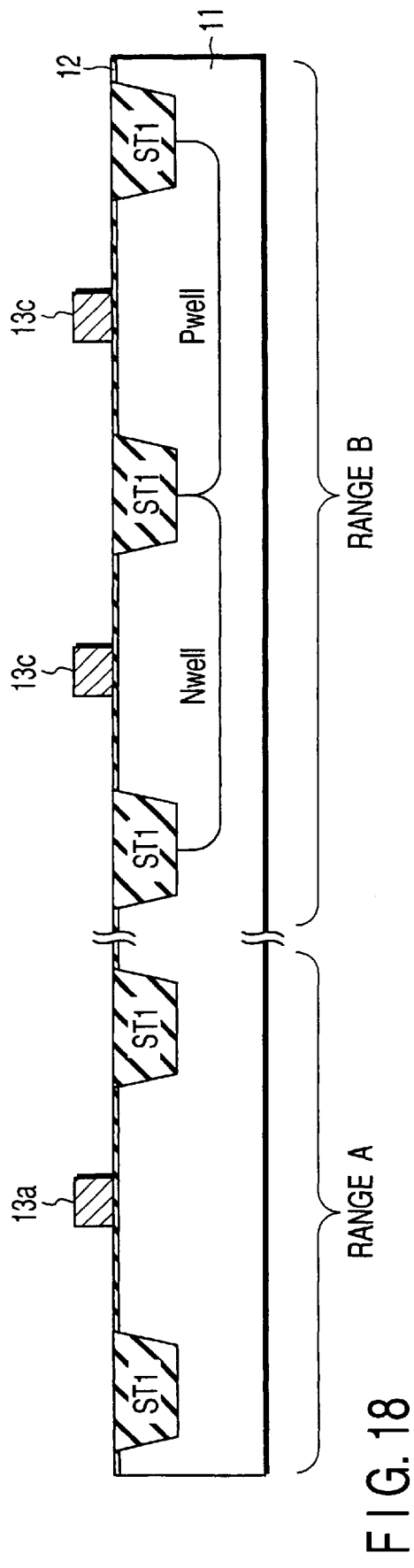
F I G. 18
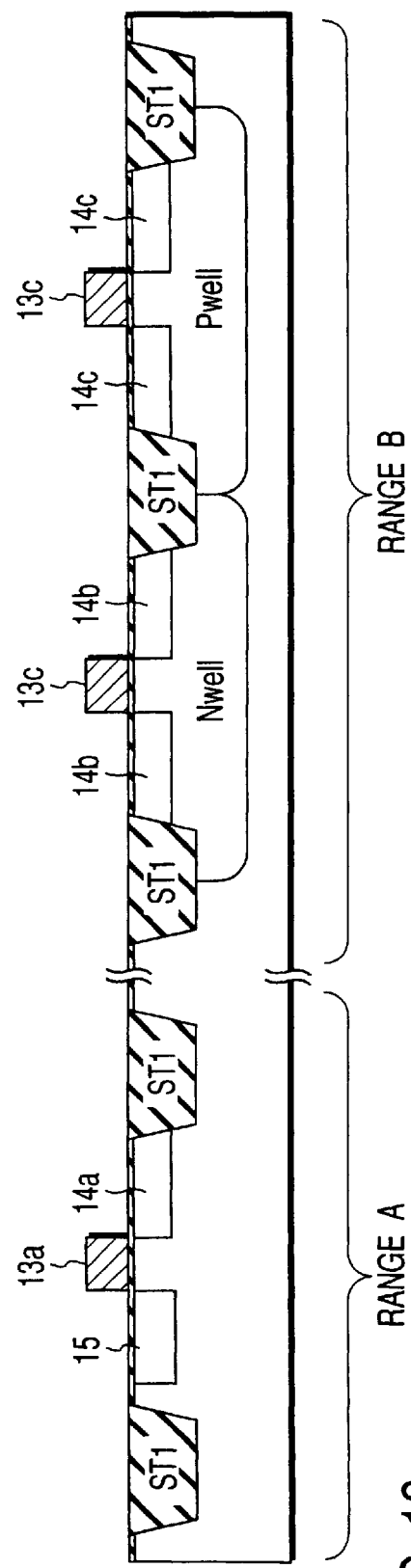
F I G. 19

US 6,642,087 B2

SOLID STATE IMAGING DEVICE HAVING A PHOTODIODE AND A MOSFET AND METHOD OF MANUFACTURING THE SAME

This application is a division of application Ser. No. 09/801,919 filed on Mar. 9, 2001.

CROSS-REFERENCE TO RELATED APPLICATIONS

This application is based upon and claims the benefit of priority from the prior Japanese Patent Applications No. 2000-088971, filed Mar. 28, 2000; and No. 2000-302660, filed Oct. 2, 2000, the entire contents of which are incorporated herein by reference.

BACKGROUND OF THE INVENTION

The present invention relates to a solid state imaging device having a photodiode and a MOSFET and a method of manufacturing the same.

Many people have recently had an opportunity to capture, process and edit an image with ease as personal computers and personal digital assistants have sprung into wide use. For solid state imaging devices which are constituted chiefly of a CCD, the needs to decrease in size, power consumption and manufacturing costs have grown. To meet these needs, a MOS solid state imaging sensor, which is manufactured based on the general-purpose CMOS semiconductor technique (commonly called a CMOS image sensor), has made an appearance and started to become popular. The CMOS image sensor is currently fabricated with design rules of 0.35 µm or more. In the future, however, it is expected that the CMOS image sensor will be downsized further according to the needs to decrease in size and power consumption.

FIG. 29 is a cross-sectional view showing a prior art MOS solid state imaging device as disclosed in Jpn. Pat. Appln. KOKAI Publication No. 10-150182. In FIG. 29, range A is a pixel region and range B is a peripheral circuit region.

As FIG. 29 shows, polysilicon-made gate electrodes 13a, 13b and 13c are selectively formed on a P-type silicon substrate 11 with a gate insulating film (silicon oxide film) 12 interposed therebetween. In the range A, 13a indicates a readout gate electrode and 13b denotes a reset or address gate electrode. Since a LOCOS (local oxidation of silicon) structure (hereinafter referred to as LOCOS) is generally used in a non-fine pattern formed with design rules of 0.35 µm or more, an element isolation region of the LOCOS structure is selectively formed in the silicon substrate 11.

In the range A, an N-type drain region 14a and an N-type signal storage region 15 for a photodiode are formed in a desired area of the surface of the silicon substrate 11. A P+-type surface shield region 21 is formed on the surface of the region 15. Thus, P+NP-type buried photodiodes 34a and 34b for storing signal charges corresponding to an amount of incident light are formed. In the range B, an N-well and a P-well are formed in the silicon substrate 11, and a P-type source and drain region 14b and an N-type source and drain region 14c are formed in the N-well and the P-well, respectively.

A first interlayer insulating film 25 is formed on the entire surface of the resultant structure, and a second interlayer insulating film 27 is formed on the film 25. An Al light-shielding film 28 is formed on the film 27. The film 28 has an opening 30 through which light is incident upon the photodiodes 34a and 34b. An Al wiring layer 26 is selectively formed in the second interlayer insulating film 27 and on the first interlayer insulating film 25. The layer 26 serves as a signal line and a connection line in units of pixels. A surface protection film 29 such as a silicon nitride film is formed on the top of the structure. In some cases, intermediate refracting films such as Ti and TiN films can be provided on the tops and undersides of the Al wiring layer 26 and the Al light-shielding film 28 to prevent light from being reflected therefrom (as disclosed in Jpn. Pat. Appln. KOKAI Publication No. 11-45989).

In the MOS solid state imaging device so constituted, the signal charges stored in the signal storage region 15 are read out of the N-type drain region 14a if a positive voltage is applied to the readout gate electrode 13a, thus modulating the potential of the drain region 14a. The region 14a is electrically connected to the gate electrode 13b of an amplification transistor, and an electrical signal amplified by the gate electrode 13b is output from the Al wiring layer 26 of the signal line.

However, stray light produces a greatly adverse effect as one problem caused when the pixels are downsized further in the prior art solid state imaging device described above.

The stray light means part of light incident upon the photodiodes 34a and 34b which is reflected by the surface of the silicon substrate 11 and then multi-reflected by the surfaces of the Al wiring layer 26, drain region 14a and gate electrode 13b and which goes in the distance. In the device shown in FIG. 29, the surfaces of the gate electrodes 13a to 13c and those of the source and drain regions 14a to 14c are made of silicon materials whose reflectivity is as high as 40% or more in a visible-light region. For this reason, stray light reflected by the surface of the photodiode 34a does not attenuate sufficiently but reaches its adjacent photodiode 34b, thereby causing a false signal such as smear and blooming.

If an interval between the photodiodes 34a and 34b shorten as the pixels decrease in size, it is natural that more intensive stray light enters a nearer photodiode, with the result that a false signal such as smear and blooming is easy to occur. Since the stray light does not attenuate sufficiently, it arrives at the source and drain regions 14b and 14c and the gate electrode 13c in the peripheral circuit region (range B) to cause the transistor to malfunction. In future, therefore, an adverse effect of the stray light will be increased more greatly as the pixels are downsized.

Currently the CMOS image sensor employs a power supply voltage of 3.3V or higher. It is expected that a CMOS image sensor operating at a power supply voltage of 3.3V or lower will be developed according to the above micromachining of 0.35 µm or less in order to decrease the size and power consumption of the solid state imaging device further.

However, using a buried photodiode structure in which a surface shield region of a conductivity type other than that of the signal storage region is formed on the surface of the photodiode, the problem of a decrease in power supply voltage of the readout gate electrode will become more serious.

FIG. 30A is a cross-sectional view of the buried photodiode which is part of the range A in FIG. 29. FIGS. 30B and 30C show potentials in low-voltage read mode (when the read gate electrode turns on). In FIG. 30C, charges are read out at a voltage lower than that in FIG. 30B.

As FIG. 30A illustrates, an element isolation region of the LOCOS structure is selectively formed in the P-type silicon substrate 11, and the readout gate electrode 13a is selectively formed on the silicon substrate 11 with the gate insulating film 12, such as a silicon oxide film, interposed therebetween. The N-type drain region 14a, N-type signal storage region 15 and P+-type surface shield region 21 are formed on the surface of the silicon substrate 11 by ion implantation. Thus, the photodiode 34a is obtained. Both the silicon substrate 11 and the surface shield region 21 are grounded at a reference potential.

In the solid state imaging device described above, when light is incident upon the photodiode 34a, the incident light is photoelectrically converted into a signal electron, and the signal electron is stored in the signal storage region 15. The surface shield region 21 serves to both prevent an interface of the gate insulating film 12 between Si and $SiO_2$ from being depleted to reduce junction leakage currents and to set potential 42 of the signal storage region 15 between the surface shield region 21 and silicon substrate 11 lower than channel potential 43 under the gate electrode 13a which is modulated by turning on the readout gate electrode 13a. In principle, the signal electrons can completely be transferred from the signal storage region 15 to the drain region 14a.

In the prior art solid state imaging device shown in FIG. 30A, however, the surface shield region 21 is all buried into the silicon substrate 11. Thus, the top surface of the region 21 is located lower than the underside of the readout gate electrode 13a. As illustrated in FIG. 30B, therefore, a potential barrier 41 occurs in a potential barrier occurring section 40 at one end of the surface shield region 21. As a result, charges 44 are not transferred completely but remain in the signal storage region 15, which causes not a little image lags and not a little noise.

When a power supply voltage drops by request or when a voltage (readout voltage) drops in the ON state of the readout gate electrode 13a (e.g., the readout voltage drops to about 2.5V from the conventional value of 3.3V), the potential barrier 41 becomes higher and more charges 45 remain as shown in FIG. 30C. Consequently, the image lags and noise increase more greatly and the sensitivity of the device lowers greatly, which are serious problems in practical use.

As described above, recently, an adverse effect of stray light has been increased more greatly as the elements have been downsized and a false signal including smear and blooming has occurred easily. Moreover, a potential barrier becomes greater as a power supply voltage lowers and accordingly image lags and noise increase further. The prior art solid state imaging device therefore causes the problem of decreasing elements due to various types of noise caused by request of element downsizing and lower power supply voltage and thus decreasing the performance of the elements.

BRIEF SUMMARY OF THE INVENTION

The present invention has been developed in order to resolve the above problems and its object is to provide a solid state imaging device capable of improving the performance of elements and a method of manufacturing the same.

To attain the above object, a solid state imaging device according to a first aspect of the present invention comprises a gate insulating film formed on a semiconductor substrate of a first conductivity type, a readout gate electrode selectively formed on the gate insulating film, a diffusion region of a second conductivity type formed on a surface of the semiconductor substrate at one end of the readout gate electrode, a signal storage region of the second conductivity type formed on the surface of the semiconductor substrate at other end of the readout gate electrode, a surface shield region of the first conductivity type formed on a surface of the signal storage region, a silicide block layer covering at least part of the signal storage region, and a metal silicide layer formed on the diffusion region.

A solid state imaging device according to a second aspect of the present invention comprises a gate insulating film formed on a semiconductor substrate of a first conductivity type, a readout gate electrode selectively formed on the gate insulating film, a diffusion region of a second conductivity type formed on a surface of the semiconductor substrate at one end of the readout gate electrode, a signal storage region of the second conductivity type formed on the surface of the semiconductor substrate at other end of the readout gate electrode, and a surface shield region of the first conductivity type formed on the signal storage region higher than the surface of the semiconductor substrate.

A solid state imaging device according to a third aspect of the present invention comprises a silicide block layer covering at least part of the signal storage region and a metal silicide layer formed on the diffusion region in addition to the constituting elements of the solid state imaging device according to the second aspect.

In the solid state imaging devices according to the first and second aspects, the semiconductor substrate can be formed of one of a well layer and an epitaxial growth layer.

In the solid state imaging devices according to the second and third aspects, the diffusion region can be formed higher than the surface of the semiconductor substrate.

In the solid state imaging devices according to the first and third aspects, the metal silicide layer can be formed of one of a Ti silicide film, a Co silicide film, a Ni silicide film, and a W silicide film.

In the solid state imaging devices according to the first and third aspects, it is preferable that the silicide block layer should cover at least part of the signal storage region and at least part of the readout gate electrode. The silicide block layer may cover at least part of the signal storage region, at least part of the readout gate electrode, and at least part of the diffusion region.

In the solid state imaging devices according to the second and third aspects, it is preferable that the surface shield region should have an underside which is flush with that of the readout gate electrode.

The solid state imaging devices according to the third aspect may further comprises a gate electrode separated from the readout gate electrode at a predetermined interval, source and drain regions formed at both ends of the gate electrode higher than the surface of the semiconductor substrate, and a metal silicide layer formed on the source and drain regions.

A solid state imaging device according to the present invention may comprise a readout gate electrode selectively formed on a semiconductor substrate of a first conductivity type with a gate insulating film interposed therebetween, a diffusion region of a second conductivity type formed on a surface of the semiconductor substrate at one end of the readout gate electrode, a metal silicide layer formed on a surface of the diffusion region, a signal storage region of the second conductivity type formed on the surface of the semiconductor substrate at other end of the readout gate electrode, a surface shield region of the first conductivity type formed on a surface of the signal storage region, a sidewall insulating film formed on a side of the one end of the readout gate electrode, and a silicide block layer covering a side of the other end of the readout gate electrode, at least part of a surface of the readout gate electrode, and at least part of the signal storage region.

A method of manufacturing a solid state imaging device according to a first aspect of the present invention, comprises the steps of forming a first insulating film on a semiconductor substrate of a first conductivity type, selectively forming an element isolation region for separating an element region in the semiconductor substrate, forming a readout gate electrode on the element region with the first insulating film interposed therebetween and a gate electrode on the element isolation region with the first insulating film interposed therebetween, forming a diffusion region of a second conductivity type on a surface of the element region at one end of the readout gate electrode, forming a signal storage region of the second conductivity type on the surface of the element region at other end of the readout gate electrode, forming a second insulating film on an entire surface of a resultant structure, removing the second insulating film and forming a silicide block layer covering at least part of the signal storage region, forming a surface shield region of the first conductivity type on a surface of the signal storage region, removing the first insulating film and the second insulating film from the diffusion region to expose a surface of the diffusion region, and forming a metal silicide layer on the exposed surface of the diffusion region.

A method of manufacturing a solid state imaging device according to a second aspect of the present invention, comprises the steps of forming a first insulating film on a semiconductor substrate of a first conductivity type, selectively forming an element isolation region for separating an element region in the semiconductor substrate, forming a readout gate electrode on the element region with the first insulating film interposed therebetween, forming a diffusion region of a second conductivity type on a surface of the element region at one end of the readout gate electrode, forming a signal storage region of the second conductivity type on the surface of the element region at other end of the readout gate electrode, and forming a surface shield region of the first conductivity type by selectively epitaxial-growing a silicon layer of the signal storage region.

A method of manufacturing a solid state imaging device according to a third aspect of the present invention, comprises the steps of forming a first insulating film on a semiconductor substrate of a first conductivity type, selectively forming an element isolation region for separating an element region in the semiconductor substrate, forming a readout gate electrode on the element region with the first insulating film interposed therebetween, forming a diffusion region of a second conductivity type on a surface of the element region at one end of the readout gate electrode, forming a signal storage region of the second conductivity type on the surface of the element region at other end of the readout gate electrode, forming a selective growth silicon layer by selectively epitaxial-growing a silicon layer of the signal storage region and the diffusion region, forming a surface shield region of the first conductivity type in the selective growth silicon layer on the signal storage region, forming a second insulating film on an entire surface of a resultant structure, removing the second insulating film so as to expose at least a surface of the selective growth silicon layer on the diffusion region and forming a silicide block layer covering at least part of the signal storage region, and forming a metal silicide layer on the exposed surface of the selective growth silicon layer on the diffusion region.

In the methods according to the second and third aspects of the present invention, the surface shield region can be formed by selectively growing a silicon layer into which no ions are implanted and then subjecting the selectively grown silicon layer to ion implantation and heat treatment. The surface shield region can also be formed by selectively growing a silicon layer into which ions are implanted.

The methods according to the first and third aspects of the present invention may further comprise a step of removing the silicide block layer after the metal silicide layer is formed.

In the solid state imaging devices and the methods described above, the elements can be improved in performance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view showing a process of manufacturing a solid state imaging device according to a first embodiment of the present invention;

FIG. 2 is a cross-sectional view showing a process of manufacturing the solid state imaging device according to the first embodiment of the present invention, which follows the process shown in FIG. 1;

FIG. 3 is a cross-sectional view showing a process of manufacturing the solid state imaging device according to the first embodiment of the present invention, which follows the process shown in FIG. 2;

FIG. 4 is a cross-sectional view showing a process of manufacturing the solid state imaging device according to the first embodiment of the present invention, which follows the process shown in FIG. 3;

FIG. 14 is a plan view showing yet another plane pattern of a silicide block layer according to the first embodiment of the present invention;

FIG. 15 is a plan view showing another plane pattern of a silicide block layer according to the first embodiment of the present invention;

FIG. 16 is a plan view showing still another plane pattern of a silicide block layer according to the first embodiment of the present invention;

FIG. 17 is a graph comparing the reflectivity of the solid state imaging device according to the first embodiment of the present invention and that of the prior art;

FIG. 18 is a cross-sectional view showing a process of manufacturing a solid state imaging device according to a second embodiment of the present invention;

FIG. 19 is a cross-sectional view showing a process of manufacturing the solid state imaging device according to the second embodiment of the present invention, which follows the process shown in FIG. 18;

DETAILED DESCRIPTION OF THE INVENTION

Figure 5:
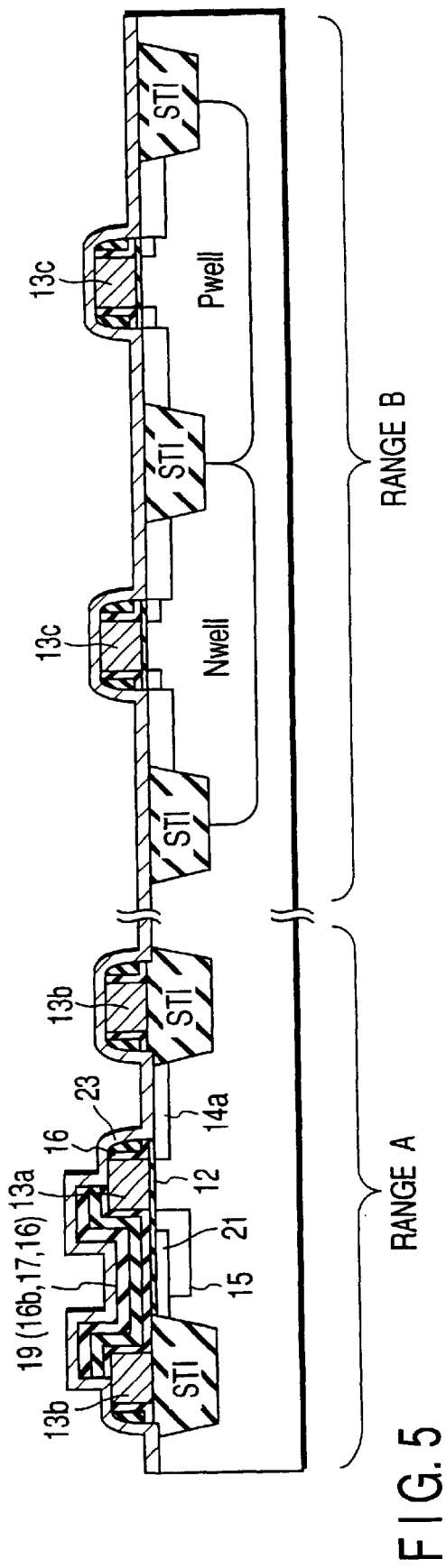
FIG. 5 is a cross-sectional view showing a process of manufacturing the solid state imaging device according to the first embodiment of the present invention, which follows the process shown in FIG. 4.

Embodiments of the present invention will now be described with reference to the accompanying drawings. In the embodiments, a CMOS image sensor is fabricated using a microfabrication technology of design rules of 0.25 $\mu$m or less. In the CMOS image sensor, an element isolation region having a shallow trench isolation (STI) structure, which is advantageous to downsizing, is used in place of the LOCOS (Local Oxidation Of Silicon) used in the prior art. In the following description, range A indicates a pixel region and range B denotes a peripheral circuit region.

[First Embodiment]

The first embodiment is featured in that a silicide film is formed on source and drain regions and a silicide block layer is formed on a photodiode.

FIGS. 1 to 7 are cross-sectional views showing a process of manufacturing a solid state imaging device according to the first embodiment of the present invention. A method of manufacturing the solid state imaging device will now be described.

First, as illustrated in FIG. 1, an element isolation region of the STI structure (referred to as an STI hereinafter) is selectively formed in the silicon substrate 11 using a known technique. The silicon substrate 11 can be formed of a well layer or an epitaxial growth layer. Then, an N-well is formed in a P-MOS transistor forming region in the range B, and a P-well is formed in an N-MOS transistor forming region therein. A gate insulating film (e.g., a silicon oxide film) 12 is formed on a P-type silicon substrate 11. Polysilicon-made gate electrodes 13a, 13b and 13c are selectively formed on the silicon substrate 11. In the range A, it is the readout gate electrode 13a that is formed on an element region and it is the reset or address gate electrode 13b that is formed on the STI. In the range B, it is the gate electrode 13c of a MOSFET that is formed on the element region.

Using optical lithography and ion implantation, an N-type drain region 14a is formed on the surface of the silicon substrate 11 at one end of the readout gate electrode 13a in the range A, and P-type LDD (lightly-doped drain) regions 14b are formed in source and drain regions of the P-MOS transistor in the range B. N-type LDD regions 14c are formed in source and drain regions of the N-MOS transistor in the range B. An N-type signal storage region 15 for the photodiode is formed on the surface of the silicon substrate 11 at the other end of the readout gate electrode 13a. Phosphorus is used as ions to be implanted when the N-type drain region 14a, N-type LDD region 14c and N-type signal storage region 15 are formed. Boron is used as ions to be implanted when the P-type LDD region 14b is formed. The order in which the regions 14a, 14b and 14c are formed by ion implantation can be changed.

In the first embodiment of the present invention, a space 11a is provided between the signal storage region 15 and one end of the STI (a boundary between the STI and the element region). The space 11a is intended for conduction between the silicon substrate 11 and a surface shield region which will be described later. A large space need not be formed between the signal storage region 15 and the end of the STI but a small space has only to be done at least partially between them. If no minute imperfections occur at the end of the STI or no junction leakage currents of the photodiode increase, the signal storage region 15 can be expanded to the end of the STI to fill in the space 11a.

As FIG. 2 illustrates, a silicon oxide film 16 having a thickness of 10 nm to 30 nm is formed on the entire surface of the resultant structure by low pressure chemical vapor deposition (LPCVD), and a silicon nitride film 17 having a thickness of 50 nm to 100 nm is formed on the silicon oxide film 16. Further, a silicon oxide film 16b having a thickness of 50 nm to 100 nm is formed on the silicon nitride film 17 by LPCVD. After that, a photoresist film 18 is selectively formed on the silicon oxide film 16 and above the signal storage region 15 by optical lithography.

Using the photoresist film 18 as a mask, the silicon oxide film 16b is removed by a wet etching liquid of a dilute oxygen fluoride type. After that, the silicon nitride film 17 is dry-etched by reactive ion etching (RIE), with the result that as shown in FIG. 3 a gate sidewall insulating film 20 is formed on the side of each of the gate electrodes 13a, 13b and 13c, and a silicide block layer 19, which is constituted of the silicon oxide film 16b and silicon nitride film 17, is formed on the signal storage region 15. Then, the photoresist film 18 is eliminated.

As FIG. 4 shows, a $P^+$-type surface shield region 21 is formed on the surface of the signal storage region 15 in the range A by optical lithography, ion implantation and heat treatment, thus forming a $P^+NP$-type buried photodiode 34 for storing signal charges corresponding to the amount of incident light. The surface shield region 21 serves to prevent a depletion layer from expanding to a $Si/SiO_2$ interface on the surface of the photodiode 34 by shielding the $Si/SiO_2$ interface. Consequently, the surface shield region 21 can prevent leakage currents from being generated on the $Si/SiO_2$ interface.

In the range B, source and drain regions 22a and 22b are formed in the element region. The source and drain regions 22a are formed in the P-MOS region by $P^+$type ion implantation, while the source and drain regions 22b are formed in the N-MOS region by $N^+$type ion implantation.

Referring to FIG. 5, the silicon oxide films 12 and 16 are removed from above the gate electrodes 13a, 13b and 13c, which are not covered with the silicide block layer 19, and from above the element region using an etching liquid of an oxygen fluoride type to expose the surfaces of the gate electrodes 13a, 13b and 13c and that of the silicon substrate 11. Thus, the silicide block layer 19 is constituted of the silicon oxide film 16, silicon nitride film 17, and silicon oxide film 16b. Then, pre-amorphous ion implantation is performed as a preprocess of metal silicification, which will be described later. The pre-amorphous ion implantation is done using As ions under condition that an acceleration voltage ranges from 15 kV to 50 kV and a dose ranges from $10^{14}$ $cm^{-2}$ to $10^{15}$ $cm^{-2}$. After that, a Ti film having a thickness of 20 nm to 30 nm is formed as a silicide metal film on the entire surface of the resultant structure by sputtering, and a TiN film having a thickness of 10 nm to 20 nm is formed on the Ti film. In FIG. 5, reference numeral 23 denotes a silicide metal film constituted of the Ti and TiN films. The silicide metal is not limited to Ti but can be formed of high-melting-point metal such as Co, Ni and W.

Figure 6:
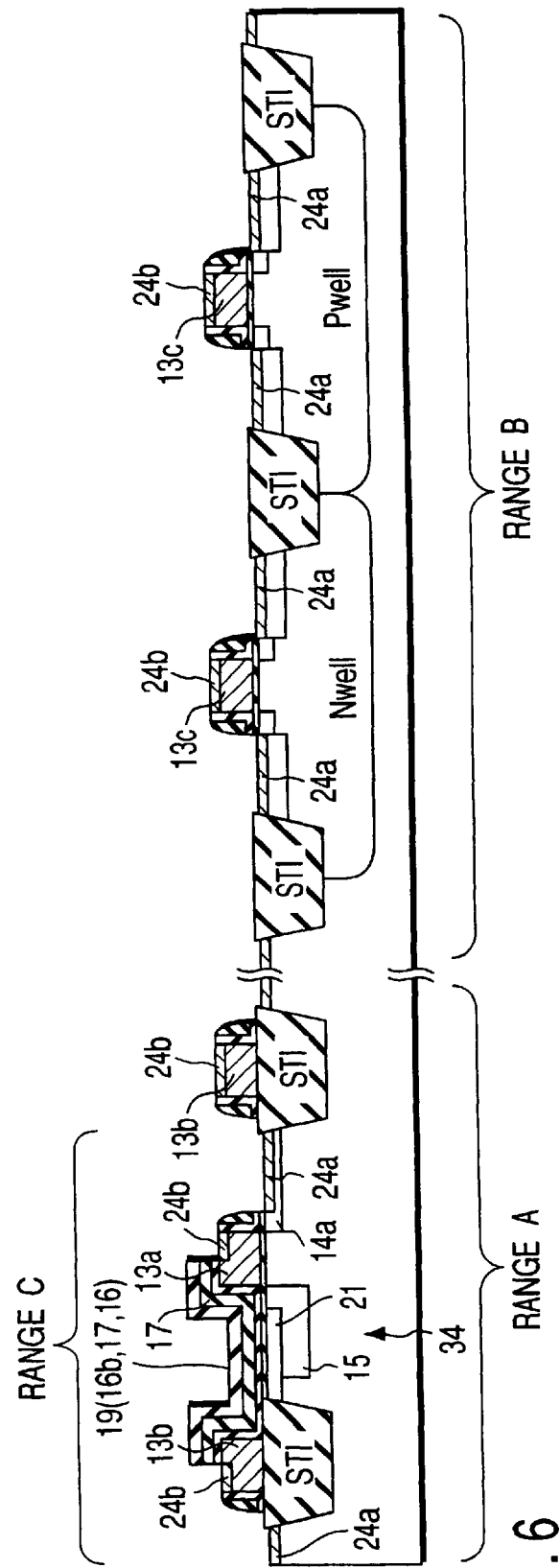
FIG. 6 is a cross-sectional view showing a process of manufacturing the solid state imaging device according to the first embodiment of the present invention, which follows the process shown in FIG. 5.

As FIG. 6 shows, rapid thermal annealing (RTA) is performed for 30 seconds to 60 seconds at temperatures ranging from 600° C. to 700° C. in a nitrogen atmosphere. In a region where the gate electrodes 13a to 13c and the element region of the silicon substrate 11 directly contacts the silicide metal film 23, silicon in the gate electrodes 13a to 13c and the silicon substrate 11 and titanium in the silicide metal film 23 react with each other, and the metal is silicificated. After that, an unreacted silicide metal film 23 is eliminated using $H_2SO_4$ and $HCl+H_2O_2$. The RTA is also performed under condition that temperature ranges from 700° C. to 800° C. and time ranges from 20 seconds to 30 seconds. Consequently, Ti silicide films ($TiSi_2$ films) 24a and 24b are formed on the surfaces of the silicon substrate 11 and gate electrodes 13a to 13c which are not covered with the silicide block layer 19.

Thereafter, the silicide block layer 19 (or only the silicon nitride film 17 constituting the silicide block layer 19) can be removed by dry or wet etching. The advantage to the case where the silicide block layer 19 remains on the photodiode 34 is that the reflectivity decreases on the surface of the photodiode 34 by the multiple interference effect of light and the sensitivity improves since the silicon nitride film 17 has an intermediate refractive index between the silicon and the silicon oxide film. On the other hand, the advantage to the case where the silicide block layer 19 is removed from the photodiode 34 is that the leakage currents of the photodiode 34 due to film stress can be reduced since the silicon nitride film 17 having film stress which is about ten times as high as that of the silicon oxide film is not present on the photodiode 34. The case where the silicide block layer 19 remains will now be described.

Figure 7:
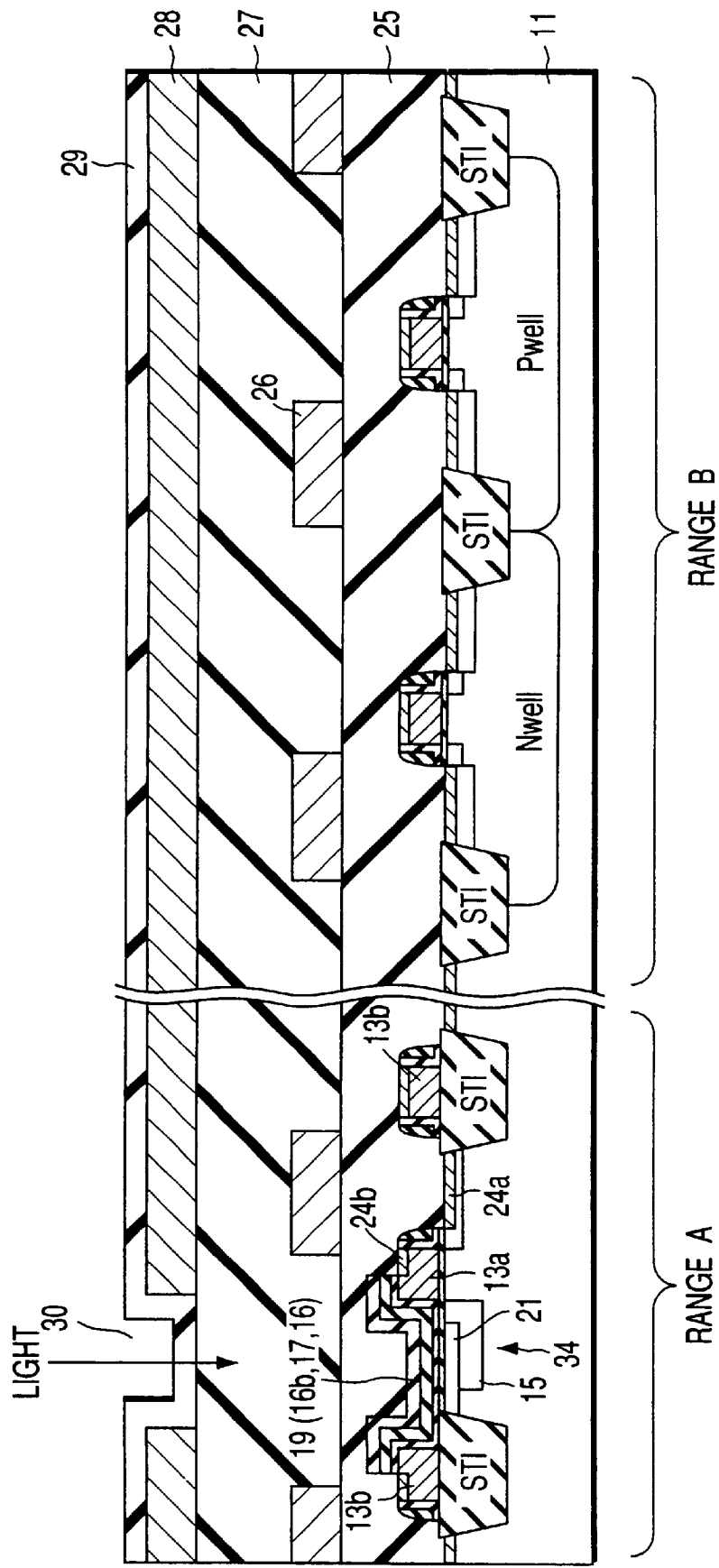
FIG. 7 is a cross-sectional view showing a process of manufacturing the solid state imaging device according to the first embodiment of the present invention, which follows the process shown in FIG. 6.

As shown in FIG. 7, a first interlayer insulating film 25 is formed on the entire surface of the resultant structure and then flattened by chemical mechanical polishing (CMP). An Al wiring layer 26 is selectively formed on the flattened first interlayer insulating film 25 to serve as a signal line and a connection line in the range A and a connection line in the range B. Then, a second interlayer insulating film 27 is formed on the entire surface of the resultant structure and flattened by CMP. An Al light-shielding film 28 is formed on the flattened second interlayer insulating film 27, and part of the film 28 above the photodiode 34 is selectively eliminated, thereby forming an opening 30 through which light is incident upon the photodiode 34. The entire surface of the range B is covered with the Al light-shielding film 28. After that, a surface protection film 29 such as a silicon nitride film is formed on the entire surface of the resultant structure.

A plane pattern of the silicide block layer 19 in the range A of the solid state imaging device so constituted will now be described.

Figure 8:
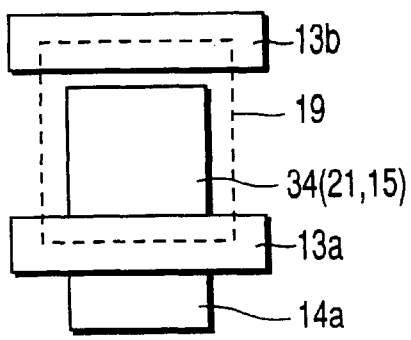
FIG. 8 is a plan view showing a plane pattern of a silicide block layer according to the first embodiment of the present invention.

FIG. 8 is a top view of a range C in FIG. 6. As FIG. 8 shows, the photodiode 34 is formed adjacent to one end of the gate electrode 13a of the readout transistor, and the gate electrode 13b of the reset or address transistor is spaced from the photodiode 34. The drain region 14a is formed adjacent to the other end of the gate electrode 13a. Further, the silicide block layer 19 is formed so as to cover the entire surface of the photodiode 34 and part of each of the gate electrodes 13a and 13b.

Figure 11:
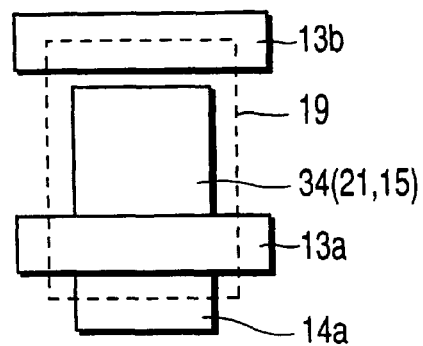
FIG. 11 is a plan view showing yet another plane pattern of a silicide block layer according to the first embodiment of the present invention.
Figure 9:
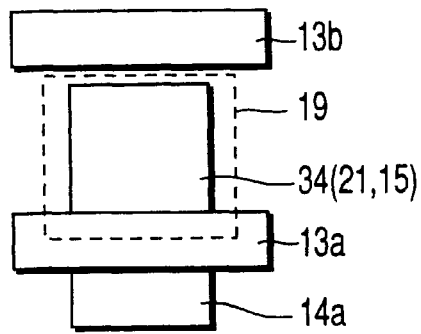
FIG. 9 is a plan view showing another plane pattern of a silicide block layer according to the first embodiment of the present invention.
Figure 12:
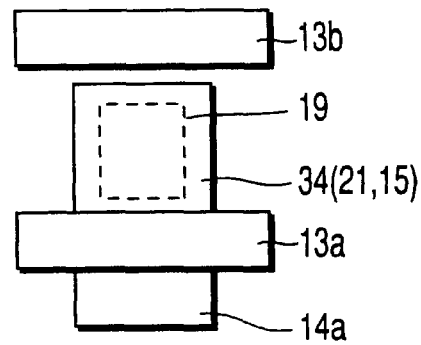
FIG. 12 is a plan view showing another plane pattern of a silicide block layer according to the first embodiment of the present invention.
Figure 10:
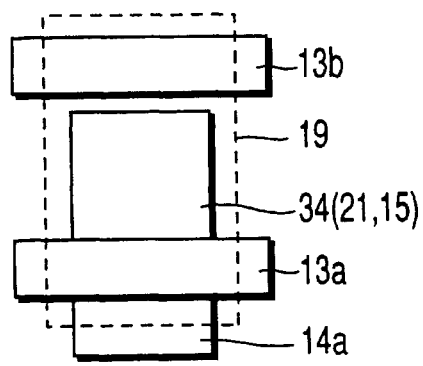
FIG. 10 is a plan view showing still another plane pattern of a silicide block layer according to the first embodiment of the present invention.
Figure 13:
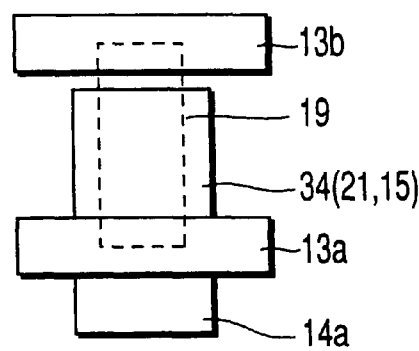
FIG. 13 is a plan view showing still another plane pattern of a silicide block layer according to the first embodiment of the present invention.

FIGS. 9 to 11 illustrate modifications to the pattern of the silicide block layer 19 covering the photodiode 34.

FIG. 9 shows a pattern of the silicide block layer 19 which covers part of one of the gate electrodes 13a and 13b. FIG. 10 shows a pattern of the silicide block layer 19 which covers both the gate electrodes 13a and 13b transversally. FIG. 11 shows a pattern of the silicide block layer 19 which covers part of one of the gate electrodes 13a and 13b and covers the other transversally.

When the silicide block layer 19 covers the gate electrodes 13a and 13b transversally as shown in FIGS. 10 and 11, the area of the gate electrodes 13a and 13b, which is not silicificated, is large and thus the wiring resistance increases. This is because that the resistance of polysilicon wiring when the gate electrodes are silicificated is one digit lower than that when they are not silicificated. In order to drive a pixel signal at high speed (when the number of pixels is large or the frame frequency is high), therefore, it is desirable to employ the pattern of the silicide blocks shown in FIGS. 8 and 9 to suppress a wiring delay.

FIGS. 12 to 15 also show modifications to the pattern of the silicide block layer which covers part of the photodiode 34. In the present invention, it is effective to employ these modifications. It is more effective in suppressing stray light to cover part of the surface of the photodiode 34 with a metal silicide film such as the Ti silicide film ($TiSi_2$ film) 24a. It is however likely that junction leakage currents will increase in the silicificated photodiode and so will noise of dark current. It is therefore needless to say that an appropriate pattern of the silicide block layer be selected in view of a balance between the suppression of stray light and the decrease in noise of dark current.

The entire surface of the drain region 14a can be covered with the silicide block layer 19 as illustrated in FIG. 16. In this case, an increase in junction leakage current caused by silicification of the drain region 14a is lost; therefore, when signal charges are transferred to the drain region 14a, noise caused afterward can be reduced.

FIG. 17 shows the reflectivity of each of the metal silicide films ($TiSi_2$ film and $CoSi_2$ film) used in the present invention and that of the prior art silicon (Si). The values of the reflectivity shown in FIG. 17 are measured when a sample is provided in the atmosphere and light is incident at an incident angle of 8°.

As FIG. 17 snows, the reflectivity of each of the $TiSi_2$ and $CoSi_2$ is lower than that of Si in a visible light range of 300 nm to 700 nm. In particular, the reflectivity of $CoSi_2$ can be decreased to a very small value of 30% or less.

When the $TiSi_2$ film was used, the amount of false signals generated due to stray light in adjacent pixels could be reduced to about 60% of that when the prior art silicon (Si) was used. When the $CoSi_2$ film of low reflectivity was used, the above amount of false signals could be reduced to about 30% thereof. Even when $NiSi_2$ and $WSi_2$ were used, the same advantages could be obtained.

According to the first embodiment described above, the Ti silicide film 24a of low reflectivity is formed on the drain region 14a and the source and drain regions 22a and 22b. The film 24a can prevent stray light from being reflected to sufficiently suppress the occurrence of false signals (smear and blooming) due to the stray light. Since the film 24 can also prevent stray light from reaching a peripheral circuit, the transistors can be prevented from malfunctioning. Consequently, the elements can be improved in performance.

The silicide block layer 19 is formed on the photodiode 34. The layer 19 allows the reflectivity on the surface of the photodiode 34 to decrease about 10% to 30% by the multiple interference effect. The light sensitivity of the solid state imaging device can be about 1.2 times as high as that of the prior art image pickup device.

If the silicide block layer 19 is eliminated after the Ti silicide films 24a and 24b are formed, the silicon nitride film 17 having film stress which is about 10 times as high as that of the silicon oxide film is not present on the photodiode 34; therefore, leakage currents of the photodiode 34 due to the film stress can be decreased. When the silicide block layer 19 is removed, a sufficient amount of hydrogen atoms, which is supplied by a sintering process, is not cut off by the silicon nitride film 17 of the layer 19 but can reach the photodiode 34. Thus, an adequate sintering effect is obtained and the leakage currents of the photodiode 34 can be reduced further. The sintering process is a process of forming a plasma nitride film containing a large amount of hydrogen near the final stage and then thermally treating it at 450° C. for about thirty minutes to cause hydrogen atoms to diffuse toward the silicon substrate. The sintering process has the main advantage of inactivating the interface between Si and $SiO_2$ to reduce junction leakage currents.

The silicide block layer 19 can prevent a silicide film whose transmittance is very low (20% or less) from being formed on the photodiode 34. Since, therefore, a sufficient amount of incident light can be supplied to the photodiode 34, the sensitivity of the solid state imaging device can be heightened even when a CMOS image sensor is fabricated through the silicification process. Since no crystal defects due to silicification are introduced into the photodiode 34, junction leakage currents of the photodiode 34 can be reduced. It is thus possible to reduce both a white point image defect which decreases yields and a dark current-ununiformity due to variations in leakage currents which degrades image quality.

Since the silicide block layer 19 has a three-layer structure of the silicon oxide film 16, silicon nitride film 17 and silicon oxide film 16b, the following advantages can be obtained.

First, the advantage of the silicon oxide film 16b is as follows. If a metal film such as a Ti/TiN film is directly deposited on the silicon nitride film 17 to anneal the structure for silicification, the surface of the film 17 will slightly be silicificated, thus causing a problem that an amount of light incident upon the photodiode 34 is decreased. However, this problem can be resolved by forming the silicon oxide film 16b on the silicon nitride film 17.

Secondly, the advantage of the silicon nitride film 17 is as follows. Since the film 17 has an intermediate refractive index between the silicon and the silicon oxide film, the reflectivity on the surface of the photodiode 34 can be lowered, with the result that an amount of light incident upon the photodiode 34 increases and the sensitivity of the device improves.

Lastly, the advantage of the silicon oxide film 16 is as follows. The silicon nitride film 17 has film stress which is about ten times as high as that of the silicon oxide film. If it were not for the silicon oxide film 16, the silicon nitride film 17 would come close to the photodiode 34 through the thin gate insulating film 12 to increase leakage currents due to the film stress. The silicon oxide film 16 having a thickness of 10 nm to 30 nm serves to mitigate the stress of the silicon nitride film 17 and prevents the leakage currents of the photodiode 34 due to the stress from increasing.

In the first embodiment, the P-type silicon substrate is used in the manufacturing process. It is however needless to say that the P-type silicon substrate can be replaced with a P-type well.

Furthermore, intermediate refracting films such as a Ti film and a TiN film can be provided on the tops and undersides of the Al wiring layer 26 and Al light-shielding film 28. These intermediate refracting films allow the reflection of light from being controlled further.

[Second Embodiment]

The second embodiment is featured in that a surface shield region and elevated source and drain regions are formed using an epitaxial growth technique. In the second embodiment, the same process as that of the first embodiment will be described simply and the process different therefrom will be described in detail.

FIGS. 18 to 23 are cross-sectional views showing a process of manufacturing a solid state imaging device according to the second embodiment of the present invention. A method of manufacturing the solid state imaging device according to the second embodiment will now be described.

First, as shown in FIG. 18, an element isolation region having an STI structure (referred to as an STI hereinafter) is selectively formed in the silicon substrate 11. An N-well is formed in a P-MOS transistor forming region in the range B, and a P-well is formed in an N-MOS transistor forming region therein. A gate insulating film (e.g., silicon oxide film) 12 is formed on a silicon substrate 11 using a known technique. Gate electrodes 13a and 13c each constituted of polysilicon are selectively formed on the silicon substrate 11.

By optical lithography and ion implantation, an N-type drain region 14a is formed on the surface of the silicon substrate 11 at one end of the gate electrode 13a in the range A, and P-type LDD regions 14b are formed in source and drain regions of the P-MOS transistor in the range B, as shown in FIG. 19. N-type LDD regions 14c are formed in source and drain regions of the N-MOS transistor in the range B. An N-type signal storage region 15 for a photodiode is formed on the surface of the silicon substrate 11 at the other end of the gate electrode 13a in the range A.

Figure 20:
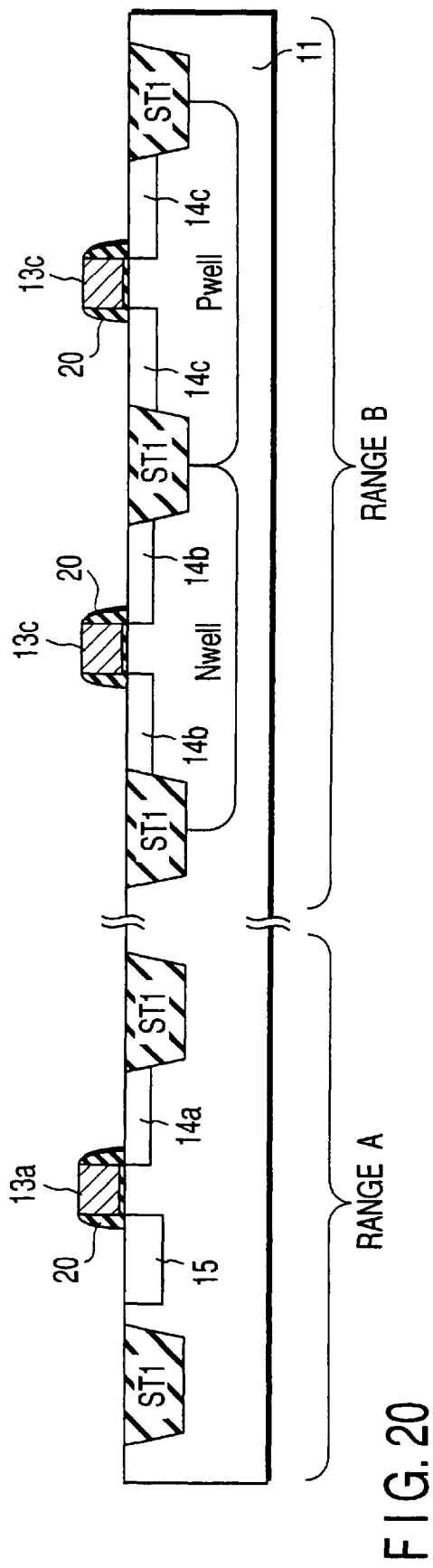
FIG. 20 is a cross-sectional view showing a process of manufacturing the solid state imaging device according to the second embodiment of the present invention, which follows the process shown in FIG. 19.

As illustrated in FIG. 20, a silicon oxide film (or a silicon nitride film) is formed on the entire surface of the resultant structure. The silicon oxide film is dry-etched by RIE and a gate sidewall insulating film 20 is formed on the side of each of the gate electrodes 13a and 13c. After that, the gate insulating film 12 is removed by an etching liquid of an oxygen fluoride type, and the surface of the cleaned silicon substrate 11 is exposed.

Figure 21:
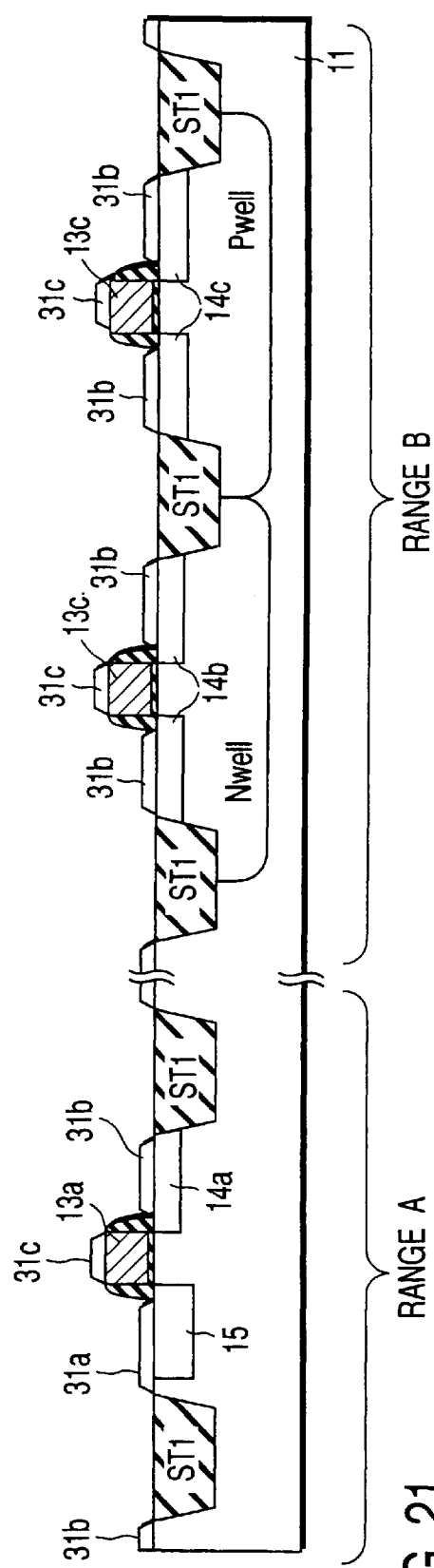
FIG. 21 is a cross-sectional view showing a process of manufacturing the solid state imaging device according to the second embodiment of the present invention, which follows the process shown in FIG. 20.

As shown in FIG. 21, undoped selective growth silicon layers 31a, 31b and 31c are grown on the surface of the silicon substrate 11 and those of the gate electrodes 13a and 13c by selective epitaxial growth. The selective growth has only to be performed by LPCVD using a mixture of dichlorsilane, hydrogen and hydrochloric acid under condition that pressure is 50 Torr and substrate temperature is 850° C. The growth time is set in such a manner that the thickness of each of the selective growth silicon layers 31a, 31b and 31c falls within a range from 20 nm to 200 nm. Thus, the drain region 14a in the range A and the LDD regions 14b and 14c in the range B are formed as layers which are higher than the surface of the silicon substrate 11 (referred to as elevated source and drain regions).

In the second embodiment, the selective growth silicon layer 31c is formed on each of the gate electrodes 13a and 13c. If an insulating film such as a silicon oxide film is left on the gate electrodes 13a and 13c prior to selective epitaxial growth, no selective growth silicon layers are formed on the gate electrodes 13a and 13c as a natural result. According to the purport of the present invention, no selective growth silicon layers need to be formed on the gate electrodes 13a and 13c.

Figure 22:
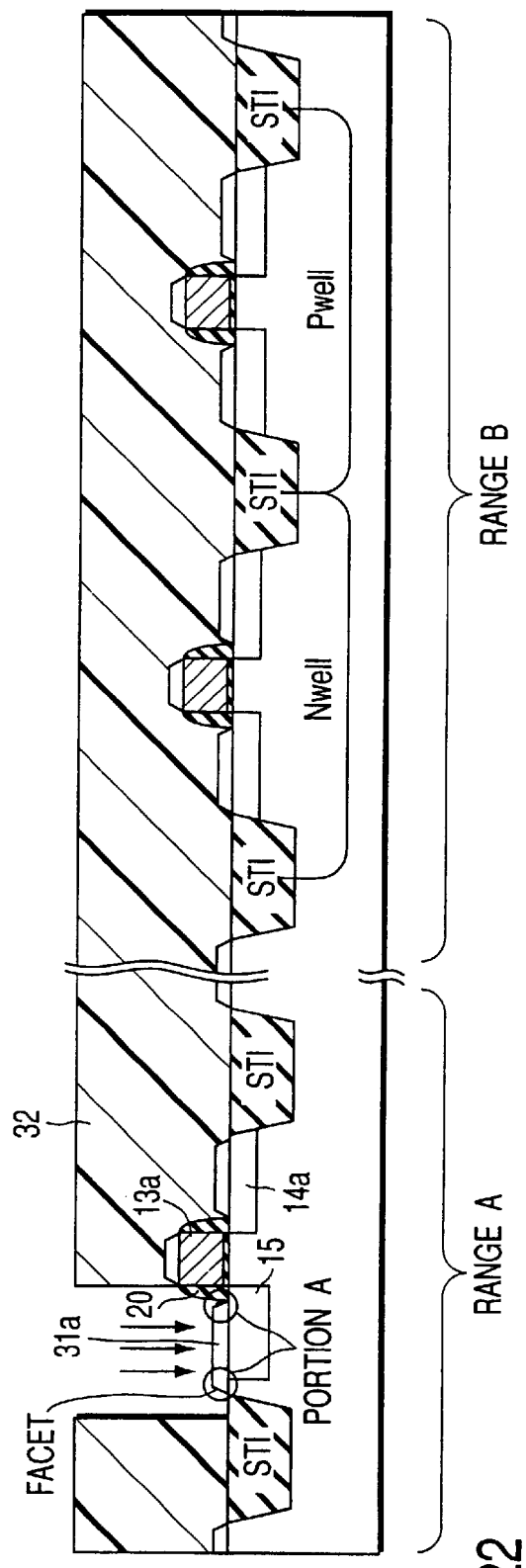
FIG. 22 is a cross-sectional view showing a process of manufacturing the solid state imaging device according to the second embodiment of the present invention, which follows the process shown in FIG. 21.

As illustrated in FIG. 22, a photoresist film 32 is formed on the entire surface of the resultant structure and patterned to form an opening above a signal storage region 15 for a photodiode. Using the patterned photoresist film 32 as a mask, boron ions such as $BF_2$ ions are implanted into the selective growth silicon layer 31a on the signal storage region 15 under condition that acceleration voltage is 30 keV and dose is $4 \times 10^{13}$ cm$^{-2}$. After that, the photoresist film 32 is eliminated.

Figure 23:
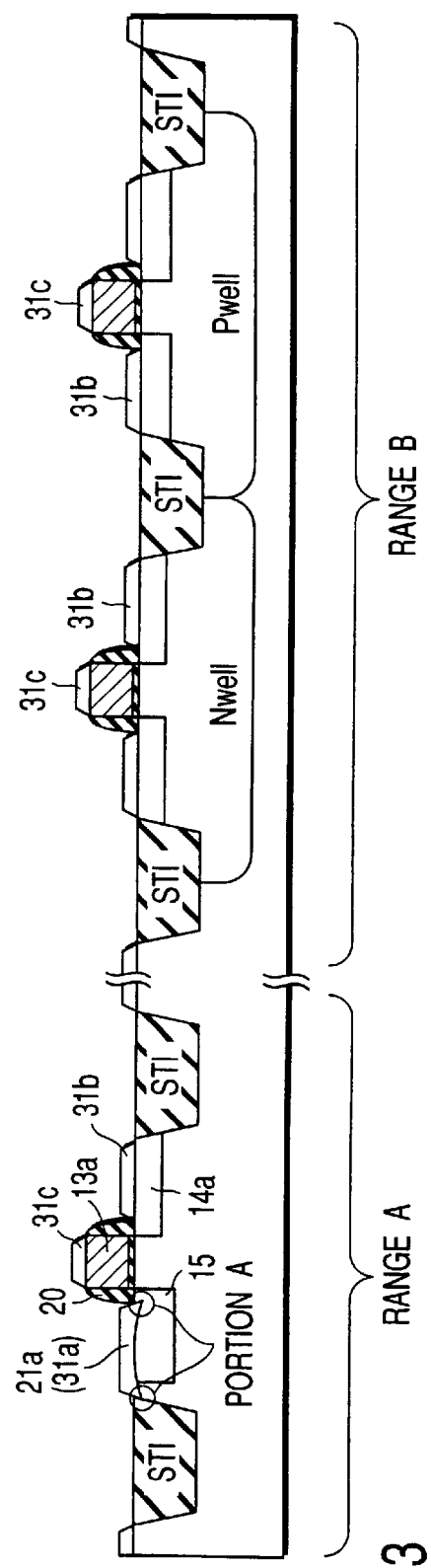
FIG. 23 is a cross-sectional view showing a process of manufacturing the solid state imaging device according to the second embodiment of the present invention, which follows the process shown in FIG. 22.

As illustrated in FIG. 23, desired heat treatment is performed, with the result that the selective growth silicon layer 31a is formed as a P$^+$-type layer (whose concentration ranges from $10^{18}$ to $10^{20}$ atms/cm$^3$) and a surface shield region 21a is formed on the surface of the signal storage region 15. By adjusting the acceleration voltage and the dose for ion implantation required when the surface shield region 21a is formed, the concentration profile of the region 21a can be set freely, thereby forming a P$^+$NP-type photodiode for storing signal charges corresponding to the amount of incident light.

As shown in FIG. 22, the selective growth silicon layer 31a has a facet since it is formed by the epitaxial growth technique. Those portions of the selective growth silicon layer 31a that contact one end of the gate sidewall insulating film 20 and that of the STI are thinned. Boron is ion-implanted more deeply in the thin portions (portions A) of the selective growth silicon layer 31a. As a result, as shown in FIG. 23, the surface shield region 21a is formed deeply under the surface of the silicon substrate 11 in the portions A.

Figure 24A:
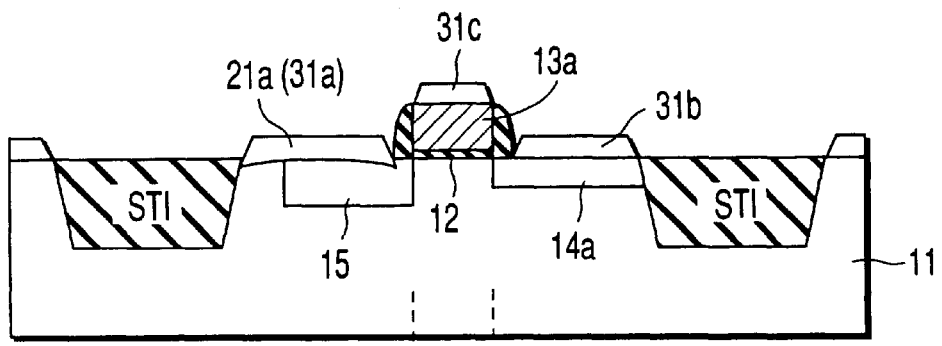
FIG. 24A is a cross-sectional view showing part of the solid state imaging device according to the second embodiment of the present invention.
Figure 24B:
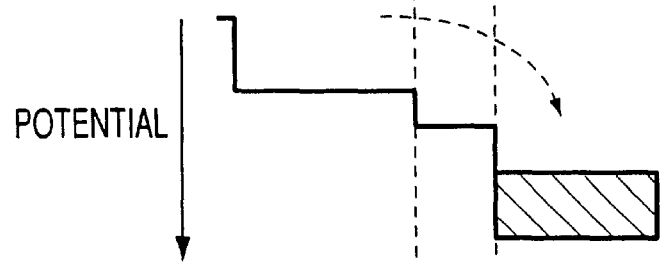
FIG. 24B is a diagram showing a potential in a read mode at a low voltage.
Figure 24C:
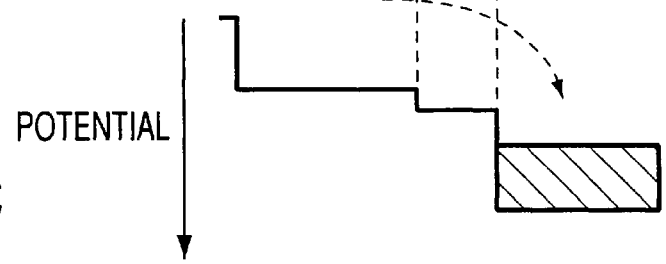
FIG. 24C is a diagram showing a potential in a read mode at a voltage lower than the voltage in FIG. 24B.

FIG. 24A is a cross-sectional view of a buried photodiode structure which is part of the range A shown in FIG. 23. FIGS. 24B and 24C each show a potential in a low-voltage read mode (when the readout gate electrode turns on). The readout voltage in the case of FIG. 24C is lower than that in the case of FIG. 24B. The voltage in FIG. 24B is 3.3V, while that in FIG. 24C is 2.5V.

As shown in FIG. 24A, the surface shield region 21a is formed based on the selective growth silicon layer 31a. The top surface of the region 21a is located above the underside of the gate electrode 13a, and the underside of the region 21a is located slightly below the underside of the gate electrode 13a.

Figure 30A:
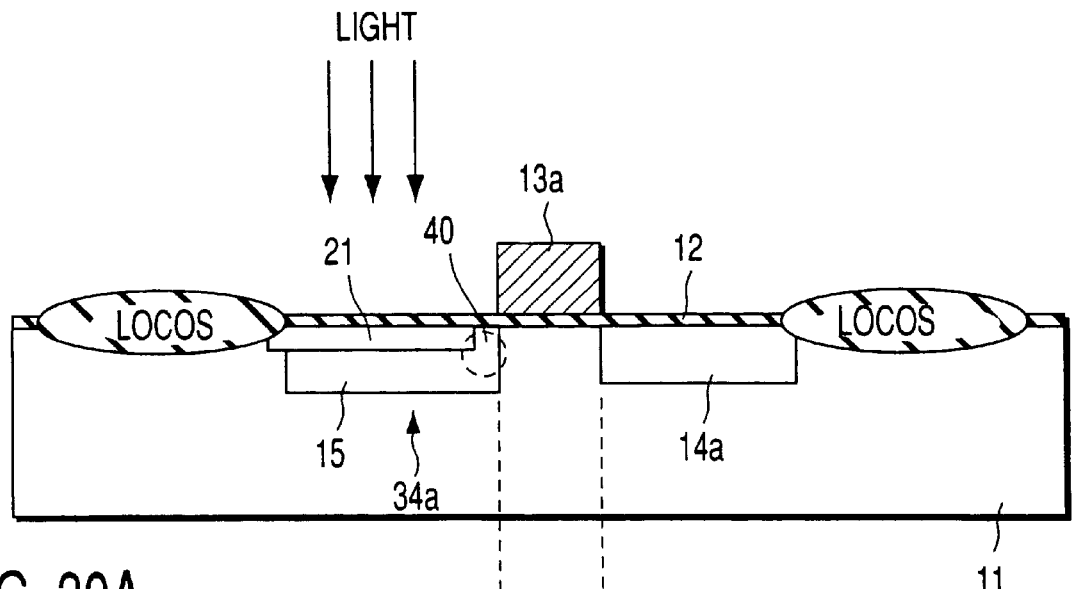
FIG. 30A is a cross-sectional view showing part of the prior art solid state imaging device.
Figure 30B:
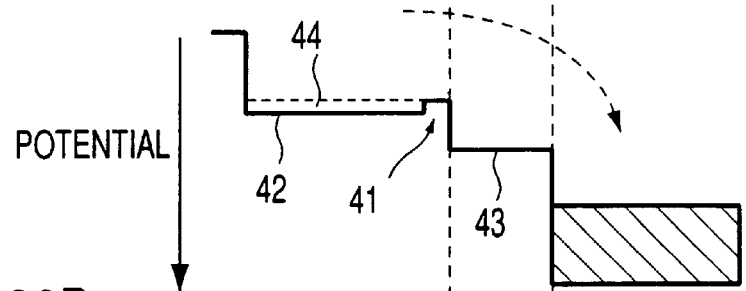
FIG. 30B is a diagram showing a potential in a read mode at a low voltage.
Figure 30C:
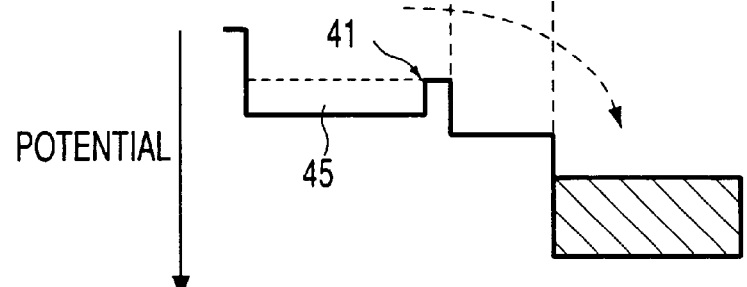
FIG. 30C is a diagram showing a potential in a read mode at a voltage lower than the voltage in FIG. 30B.

Consequently, the surface shield region 21a can be formed considerably more shallowly on the underside of the gate electrode 13a than in the prior art structure shown in FIG. 30A. When the signal charges are read out of the signal storage region 15, as shown in FIGS. 24B and 24C, the potential barriers shown in FIGS. 30B and 30C are vanished and no signal charges remain.

According to the second embodiment described above, the surface shield region 21a is formed on the silicon substrate 11 by the selective epitaxial growth technique. In the signal readout mode, therefore, a potential barrier is vanished from one end of the region 21a and that of the gate electrode 13a and no signal charges remain in the signal storage region 15. The signal charges can thus be transferred completely. Consequently, even though a buried photodiode structure is employed as in the prior art, the problems of many image lags, high noise and low sensitivity in the low-voltage readout mode can be resolved and thus the elements can be improved in performance.

Using the selective epitaxial growth technique, the selective growth silicon layer 31b is formed on the silicon substrate 11. The source and drain regions 14a, 14b and 14c can thus be formed as elevated source and drain ones. Consequently, leakage currents can be prevented from occurring in the pixel region (range A) and the resistance can be lowered in the peripheral circuit region (range B).

Even though the source and drain regions 14b and 14c are formed shallowly in the silicon substrate 11 by forming the elevated source and drain regions in the peripheral circuit region, the junction leakage currents can be suppressed sufficiently after the metal silicide is formed. If elevated source and drain regions are formed in the pixel region, the N-type drain region 14a can be formed shallowly in the silicon substrate 11. It is thus possible to resolve the problem of punch through caused between the signal storage region 15 and drain region 14a when the gate electrode 13a is shortened. Since the gate electrode 13a can be shortened, the pixels can be downsized.

In the second embodiment, the surface shield region 21a is formed by selective growth of an undoped silicon layer (FIG. 21), ion implantation of boron (FIG. 22), and heat treatment. However, the present invention is not limited to these methods.

For example, a boron-implanted P$^+$-type silicon layer can be grown selectively. When a P$^+$-type silicon layer is selectively grown from the beginning, heat treatment after ion implantation of boron and ion implantation can be omitted. If the surface shield region 21a is formed, not only the same advantages as those of the second embodiment but also the following advantages can be obtained.

Figure 25:
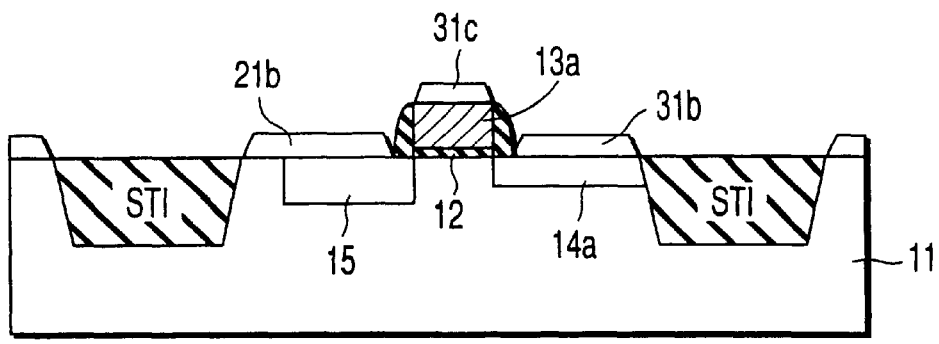
FIG. 25 is a cross-sectional view of a modification to the solid state imaging device according to the second embodiment of the present invention.

Since no defects due to ion implantation of boron are introduced into the photodiode, junction leakage currents of the photodiode can be reduced. Since boron is not implanted more deeply in the region under the facet, the underside of the surface shield region is flush with that of the gate electrode as shown in FIG. 25. In other words, the underside of a surface shield region 21b can be formed flatter and more shallowly. For this reason, a potential barrier in the signal readout mode can be lowered further and the signal charges stored in the signal storage region 15 can completely be transferred to the drain region 14a even when the readout voltage is 2V or lower.

[Third Embodiment]

Like the first embodiment, the third embodiment is featured in that a silicide film is formed on source and drain regions and a silicide block layer is formed on a photodiode. Like the second embodiment, it is featured in that a surface shield region and elevated source and drain regions are formed by the epitaxial growth technique. In the third embodiment, the descriptions of the same process as that of the second embodiment are omitted and only the process different therefrom will be described. A method of manufacturing a solid state imaging device according to the third embodiment of the present invention will now be discussed.

First, as in the second embodiment shown in FIGS. 18 to 23, a surface shield region 21a is epitaxially grown on the surface of a signal storage region 15 of a photodiode.

Figure 26:
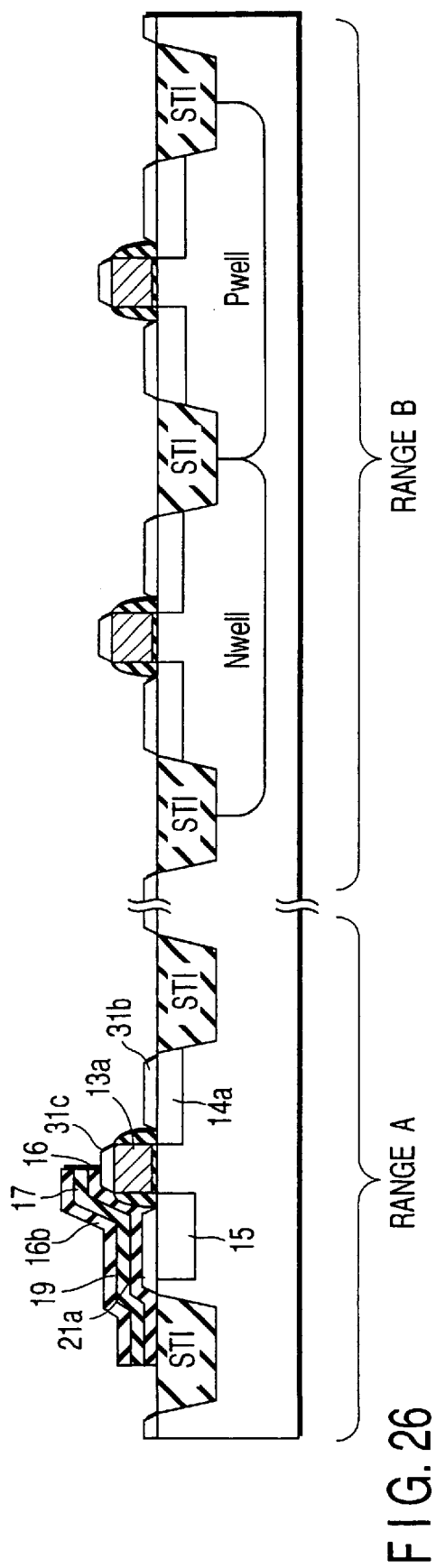
FIG. 26 is a cross-sectional view showing a process of manufacturing a solid state imaging device according to a third embodiment of the present invention.

As illustrated in FIG. 26, a silicon oxide film 16 having a thickness of 20 nm to 50 nm is formed on the entire surface of the resultant structure by LPCVD, and a silicon nitride film 17 having a thickness of 50 nm to 100 nm is formed on the silicon oxide film 16. A silicon oxide film 16b having a thickness of 50 nm to 100 nm is formed on the silicon nitride film 17 by LPCVD. After that, a photoresist film (not shown) is formed above the signal storage region 15 by optical lithography. Using the photoresist film as a mask, the silicon oxide film 16b is removed using a wet etching liquid of a dilute oxygen fluoride type. The silicon nitride film 17 and silicon oxide film 16 are dry-etched by RIE, and a silicide block layer 19 is formed of the signal storage region 15. The silicide block layer 19 prevents the surface shield region 21a from being silicificated in the subsequent silicification process.

Figure 27:
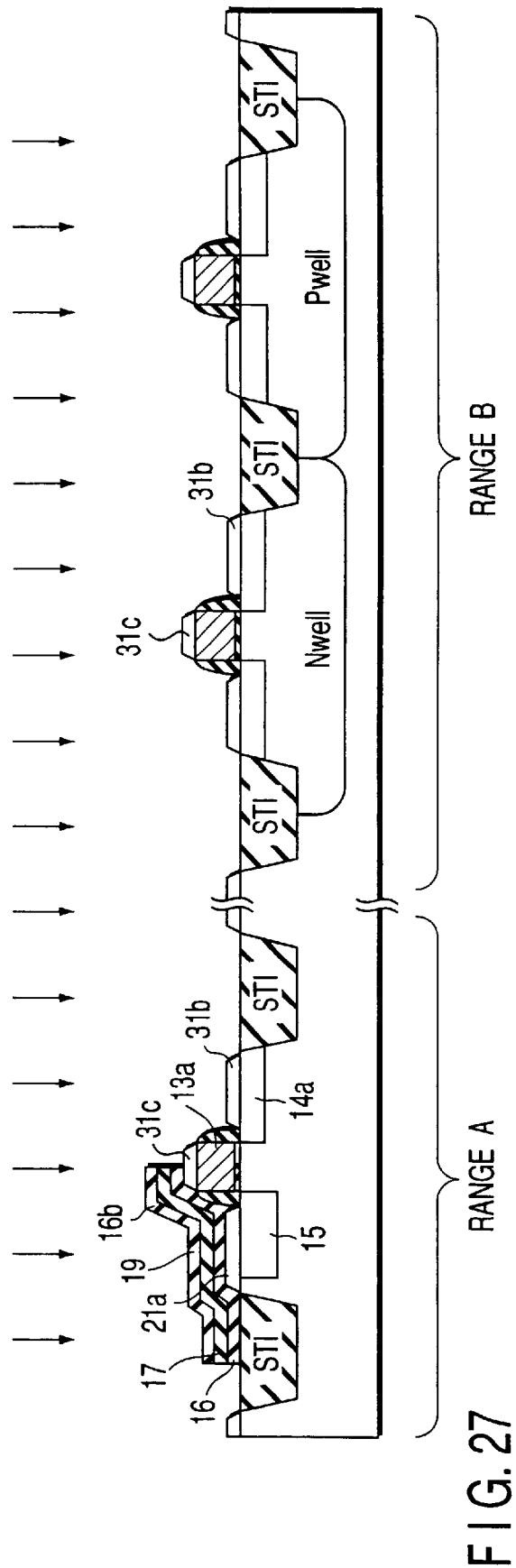
FIG. 27 is a cross-sectional view showing a process of manufacturing the solid state imaging device according to the third embodiment of the present invention, which follows the process shown in FIG. 26.

As illustrated in FIG. 27, impurity ions of the same conductivity type as that of the signal storage region 15, such as As ions, are implanted into the entire surface of the resultant structure under condition that an acceleration voltage ranges from 10 kV to 50 kV and a dose ranges from $10^{13}$ cm$^{-2}$ to $10^{15}$ cm$^{-2}$. Thus, at least the surface areas of selective growth silicon layers 31b and 31c in a region not covered with the silicide block layer 19 is made amorphous.

Figure 28:
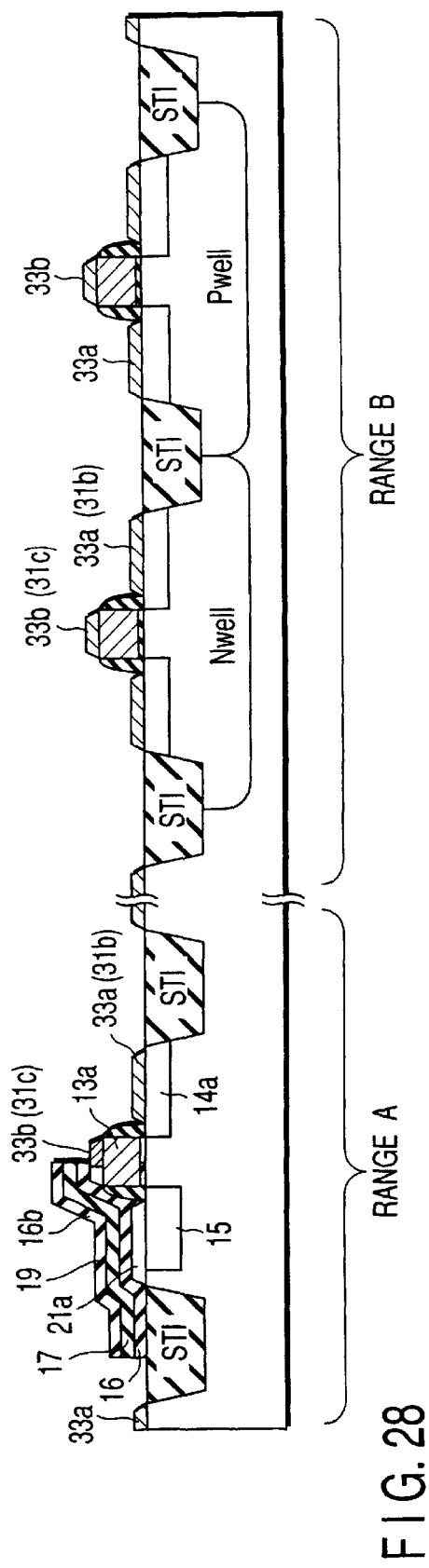
FIG. 28 is a cross-sectional view showing a process of manufacturing the solid state imaging device according to the third embodiment of the present invention, which follows the process shown in FIG. 27.
Figure 29:
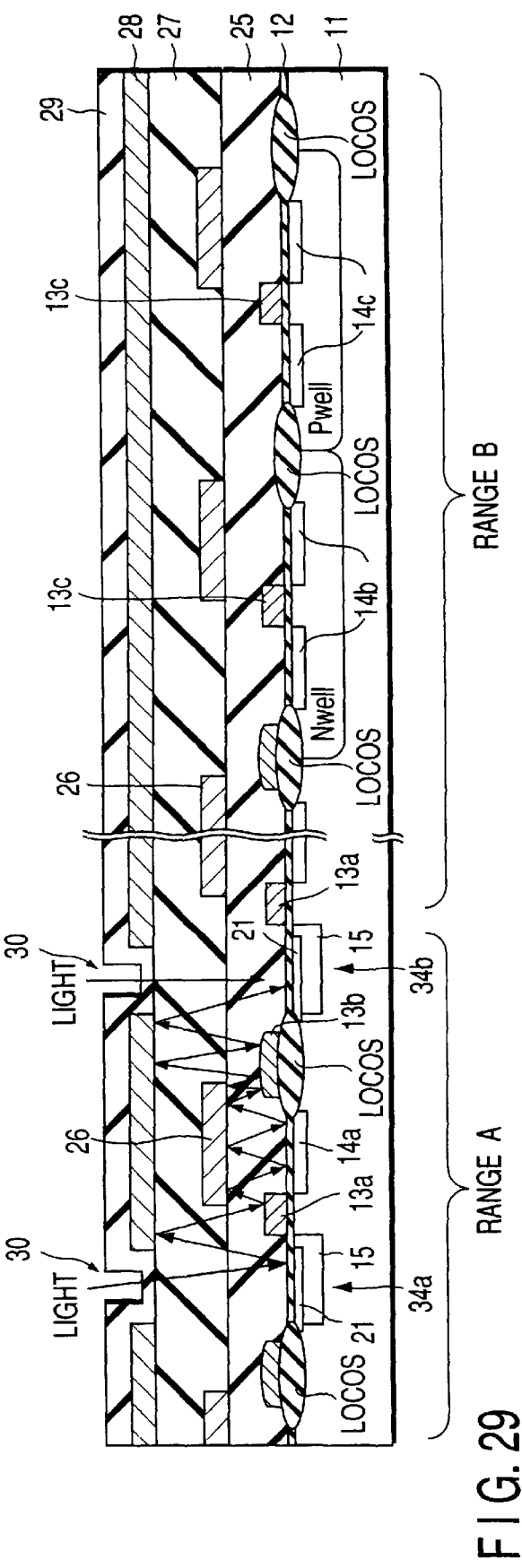
FIG. 29 is a cross-sectional view showing a prior art solid state imaging device.

As illustrated in FIG. 28, a Ti film (not shown) having a thickness of 20 nm to 40 nm is formed on the entire surface of the resultant structure by sputtering, and a TiN film (not shown) having a thickness of 10 nm to 30 nm is formed on the Ti film. Then, the structure is annealed for about 30 seconds at temperatures ranging from 700° C. to 800° C. in a nitrogen atmosphere. As a result, silicon in the selective growth silicon layers 31b and 31c and Ti in the Ti film react with each other to form Ti silicide films 33a and 33b in an interface between each of the layers 31b and 31c and the Ti film. After that, the TiN film and the unreacted Ti film 23 are eliminated by etching using a mixture of sulfuric acid and hydrogen peroxide. Thus, Ti silicide films 33a and 33b are formed on the surfaces of the selective growth silicon layers 31b and 31c which are not covered with the silicide block layer 19.

According to the third embodiment, the same advantages as those of the first and second embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a solid state imaging device, comprising the steps of:

forming a first insulating film on a semiconductor substrate of a first conductivity type;

selectively forming an element isolation region for separating an element region in the semiconductor substrate;

forming a readout gate electrode on the element region with the first insulating film interposed therebetween and a gate electrode on the element isolation region with the first insulating film interposed therebetween;

forming a diffusion region of a second conductivity type on a surface of the element region at one end of the readout gate electrode;

forming a signal storage region of the second conductivity type on the surface of the element region at other end of the readout gate electrode;

forming a second insulating film on an entire surface of a resultant structure;

removing the second insulating film and forming a silicide block layer covering at least part of the signal storage region;

forming a surface shield region of the first conductivity type on a surface of the signal storage region;

removing the first insulating film and the second insulating film from the diffusion region to expose a surface of the diffusion region; and forming a metal silicide layer on the exposed surface of the diffusion region.

2. The method according to claim 1, wherein the semiconductor substrate is one of a well layer and an epitaxial growth layer.

3. The method according to claim 1, further comprising a step of removing the silicide block layer after the metal silicide layer is formed.

4. A method of manufacturing a solid state imaging device, comprising the steps of:

forming a first insulating film on a semiconductor substrate of a first conductivity type;

selectively forming an element isolation region for separating an element region in the semiconductor substrate;

forming a readout gate electrode on the element region with the first insulating film interposed therebetween;

forming a diffusion region of a second conductivity type on a surface of the element region at one end of the readout gate electrode;

forming a signal storage region of the second conductivity type on the surface of the element region at other end of the readout gate electrode; and forming a surface shield region of the first conductivity type by selectively epitaxial-growing a silicon layer of the signal storage region.

5. The method according to claim 4, wherein the semiconductor substrate is one of a well layer and an epitaxial growth layer.

6. The method according to claim 4, wherein the surface shield region is formed by selectively growing a silicon layer into which no ions are implanted and then subjecting the selectively grown silicon layer to ion implantation and heat treatment.

7. The method according to claim 4, wherein the surface shield region is formed by selectively growing a silicon layer into which ions are implanted.

8. A method of manufacturing a solid state imaging device, comprising the steps of:

forming a first insulating film on a semiconductor substrate of a first conductivity type;

selectively forming an element isolation region for separating an element region in the semiconductor substrate;

forming a readout gate electrode on the element region with the first insulating film interposed therebetween;

forming a diffusion region of a second conductivity type on a surface of the element region at one end of the readout gate electrode;

forming a signal storage region of the second conductivity type on the surface of the element region at other end of the readout gate electrode;

forming a selective growth silicon layer by selectively epitaxial-growing a silicon layer of the signal storage region and the diffusion region;

forming a surface shield region of the first conductivity type in the selective growth silicon layer on the signal storage region;

forming a second insulating film on an entire surface of a resultant structure;

removing the second insulating film so as to expose at least a surface of the selective growth silicon layer on the diffusion region and forming a silicide block layer covering at least part of the signal storage region; and forming a metal silicide layer on the exposed surface of the selective growth silicon layer on the diffusion region.

9. The method according to claim 8, wherein the semiconductor substrate is one of a well layer and an epitaxial growth layer.

10. The method according to claim 8, wherein the surface shield region is formed by selectively growing a silicon layer into which no ions are implanted and then subjecting the selectively grown silicon layer to ion implantation and heat treatment.

11. The method according to claim 8, wherein the surface shield region is formed by selectively growing a silicon layer into which ions are implanted.

12. The method according to claim 8, further comprising a step of removing the silicide block layer after the metal silicide layer is formed.

* * * * *